United States Patent [19]

Ogawa et al.

[11] Patent Number: 4,873,022
[45] Date of Patent: Oct. 10, 1989

[54] ELECTRICALLY CONDUCTIVE PASTE, ELECTRONIC CIRCUIT COMPONENT AND METHOD FOR PRODUCING SAME

[75] Inventors: Toshio Ogawa, Katsuta; Mituru Fujii, Hadano; Tadamichi Asai, Ibaraki; Akira Ikegami, Hitachi; Hiroshi Ohtsu, Mito; Kazuhiko Ato, both of Mito, all of Japan

[73] Assignee: Hitachi, Ltd., Tokyo, Japan

[21] Appl. No.: 139,792

[22] Filed: Dec. 30, 1987

[30] Foreign Application Priority Data

Jan. 9, 1987 [JP] Japan .................................. 62-1644
Sep. 4, 1987 [JP] Japan .............................. 62-220174

[51] Int. Cl.$^4$ .............................................. B32B 3/00
[52] U.S. Cl. .................................... 428/209; 428/433; 252/512; 427/123; 427/126.2; 427/376.3; 427/96
[58] Field of Search ....................... 252/512, 500, 518; 427/96, 123, 126.2, 376.3; 428/210, 432, 433, 901; 174/68 A, 685

[56] References Cited

U.S. PATENT DOCUMENTS 4,369,063 1/1983 McGowan ......................... 106/1.14

OTHER PUBLICATIONS

Journal of Metals, May 1953, pp. 643–648.

Primary Examiner—Josephine Barr
Attorney, Agent, or Firm—Antonelli, Terry & Wands

[57] ABSTRACT

The present invention provides an electronic circuit component having a ceramic base and more particularly to a conductive paste for circuit film and an electronic circuit component having a copper film circuit of 10 μm of less in film thickness formed from said conductive paste and a method for making the electronic circuit component.

The characteristic of the present invention resides in a conductive paste comprising 100 parts by weight of copper powder of 1 μm or less in average particle size, 0.01–4 parts by weight of at least one of S, Te and Se and 1–10 parts by weight of a frit glass as a binder.

Further, there is provided an electronic circuit component having a copper film circuit containing 0.005–2 parts by weight of at least one of S, Te and Se and an effective amount of a glass as a binder for 100 parts by weight of copper which is produced by forming a circuit pattern of said conductive paste on an insulating base by flexo-printing method or the like and then firing the pattern.

Especially, since a copper film of 10 μm or less in thickness can be easily formed by printing method, an electronic circuit component having fine circuit pattern comparable to conventional gold film can be provided. This electronic circuit component is excellent as electronic circuit components which require low circuit loss.

30 Claims, 4 Drawing Sheets

ELECTRICALLY CONDUCTIVE PASTE, ELECTRONIC CIRCUIT COMPONENT AND METHOD FOR PRODUCING SAME

BACKGROUND OF THE INVENTION

The present invention relates to an electronic circuit component using a ceramic base. More particularly, it relates to an electrically conductive paste for circuit film, an electronic circuit component having a copper film circuit of 10 μm or less in film thickness formed from said paste and a method for producing the electronic circuit component.

Copper circuit conductor of thick film hybrid IC has been produced by printing-firing of a conductive paste containing copper fine powder and frit glass (cf. Japanese Patent Kokai=Laid-Open=Sho 58-68803).

The above copper circuit film has the excellent characteristic, i.e., lower electric resistance than that of other metallic materials such as gold, but has the defect of difficulty in formation of fine circuit.

Etching method according to photo-lithography has been known for producing fine patterns. This method can provide considerably fine patterns, but this method also has some limits and the accuracy of etching depends on aspect ratio (normal critical value: 1/10) determined by film thickness/width of line of the wiring circuit film to be formed.

Considering the aspect ratio, circuit patterns can be made finer with decrease in thickness of circuit film, but practically it is not easy to form a circuit film of less than 15 μm in thickness using a conductive paste.

The following methods can be considered for making a copper circuit film thinner.

One is to control the film thickness by using a paste conspicuously less in copper fine powder content than content of organic solvent or organic binder which is a vehicle or a paste comprising an organocopper compound. However, the formed copper film is reticulated due to coagulation and smooth film cannot be obtained with a film thickness of less than 15 μm.

Another is to form a copper circuit film by chemical plating or by combination of chemical plating and electroplating. According to this method, optional film thickness can be easily obtained, but the film is low in adhesiveness to a ceramic base and is apt to peel off upon undergoing heat cycle.

Other methods are sputtering method and CVD method, but mass-production equipments for these methods are difficult to obtain and besides the film is also small in adhesion strength to ceramic base.

SUMMARY OF THE INVENTION

The first object of the present invention is to provide a conductive paste with which a fine thin film circuit (film thickness: 10 μm or less) comprising copper film can be formed on a ceramic base.

The second object is to provide a conductive paste with which the film circuit can be easily formed by the conventional flexo-printing method and the like and a circuit film of smooth surface can be obtained by firing.

The third object is to provide an electronic circuit component having a fine thin film circuit (film thickness: 10 μm or less) comprising copper film on a ceramic base.

The fourth object is to provide an electronic circuit component from which the circuit film is not easily peeled off even if exposed to heat history.

DESCRIPTION OF THE INVENTION

The characteristic of the present invention resides in a conductive paste which contains 100 parts by weight of copper powder of 1 μm or less in average particle size, 0.01–4 parts by weight of at least one of S, Te and Se and 1–10 parts by weight of a frit glass as a binder. Further characteristic of the present invention resides in an electronic circuit component wherein copper film circuit obtained by forming a circuit pattern on an insulating base by flexo-printing method and the like and then firing the pattern contains 100 parts by weight of copper, 0.005–2 parts by weight of at least one of S, Te and Se and an effective amount of a glass as a binder.

As the insulating base, especially preferred are ceramic bases such as alumina, forsterite, steatite, cordierite, mullite and the like and alumina base is normally used.

S, Te and Se may be in the form of single substance or a compound thereof. Addition amount thereof is 0.01–4 parts by weight in terms of S, Se or Te for 100 parts by weight of copper. About half of these additive elements are lost at firing step and therefore they must be added making allowances for the loss. Preferred range of this addition amount is the said range of 0.01–4 parts by weight. Addition amount of this range affords 0.005–2 parts by weight of S, Te or Se in a copper circuit film after firing for 100 parts by weight of copper.

When addition amount of S, Te or Se is less than 0.01 part by weight, the copper circuit film aimed at by the present invention cannot be obtained. When more than 4 parts by weight, CuS and the like are contained in a large amount in the fired copper circuit film to cause undesirable results for circuit film such as increase in electric resistance.

Glasses used as binder for the ceramic base include the low melting point glasses mainly composed of lead borosilicate, bismuth borosilicate, zinc borosilicate or the like which are known as frit glass. Addition amount of the glass may vary depending on thickness of circuit film to be formed, but preferably 1–10 parts by weight per 100 parts of copper. Especially preferred is 2–7 parts by weight of lead borosilicate glass.

Average surface roughness (in terms of Ra) of the ceramic base is 1 μm or less and is desirably not more than 1/5 of thickness of copper film circuit to be formed thereon. Especially preferably, a glaze layer is formed on the surface of ceramic base on which copper circuit film is to be formed and the glaze layer is polished to the above roughness. The glaze layer is preferably of $SiO_2$—$Al_2O_3$—$ZnO$—$CaO$ system.

Figure 1:
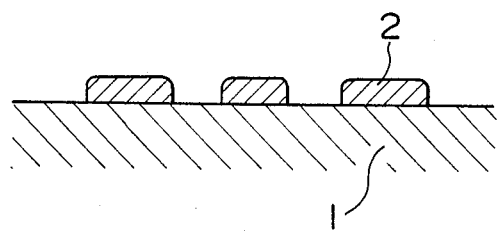
FIG. 1 is a cross-sectional view of a circuit pattern where the circuit film according to the present invention is formed by photolithographic etching method.

Film thickness of copper film circuit having uniform surface which can be easily obtained coating-firing method as mentioned above is 1 μm or more, from which fine patterns of 5-20 μm in line width of the film circuit which have never been obtained from the conventional film thickness can be formed in electronic circuit components. Especially in case a circuit pattern is formed by etching method according to photolithography, the circuit film of cross-sectional shape as shown in FIG. 1 is obtained from the thin film thickness in the present invention.

Figure 2:
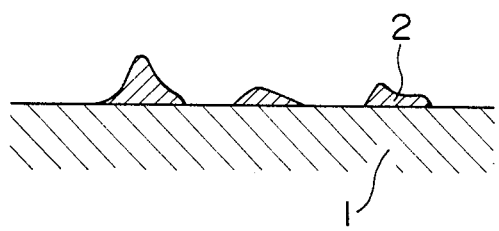
FIG. 2 is a cross-sectional view of a circuit pattern formed by photolithographic etching method from conventional circuit film.

On the other hand, when circuit pattern of 5-20 μm in line width is formed from a copper film of the conventional film thickness (more than 15 μm), it is well known for one skilled in the art that there occurs peeling-off of circuit film due to side etching or the film formed has the cross-sectional shape as shown in FIG. 2.

It is not clear why addition of S, Te and Se provides a smooth copper film of 10 μm or less in film thickness.

It is known that addition of a slight amount of sulfur or oxygen to molten copper causes reduction of surface tension. (cf. Journal of the Japan Institute of Metals, Vol. 24, 1960, No. 6, pp. 374-377 and No. 8, pp. 544-547). However, in the present invention, firing of circuit film is carried out at lower than the melting point of copper, but still the effect is exhibited and hence it is hardly considered that the direct cause for the above result is reduction of surface tension.

As a result of the inventors' examination of coagulation of copper powder and frit glass on a glazed alumina base, it has been found that both the copper powder and the frit glass become difficult to coagulate by addition of S.

This experiment was conducted by spreading in the form of a disk of 10 mm in diameter a given amount of copper or glass powder to which about 1% by weight of S was added on an alumina base and determining the amount of coagulation upon firing at 800° C., 850° C., 900° C. and 950° C., respectively. The results are shown in FIGS. 3 and 4.

Figure 3:
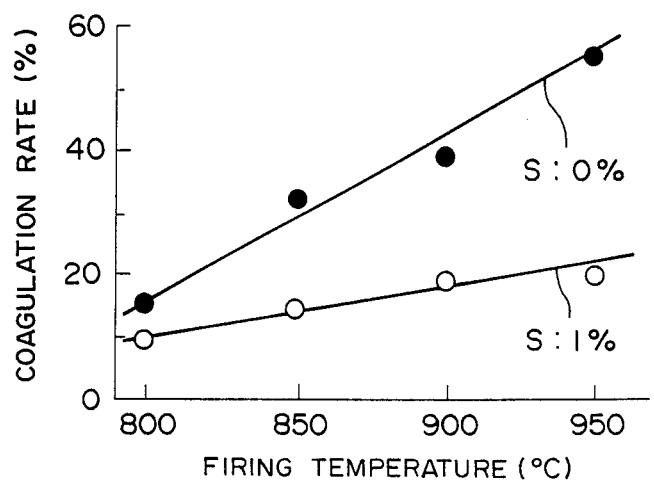
FIG. 3 is a graph which shows the relation between firing temperature and degree of coagulation of borosilicate frit glass.
Figure 4:
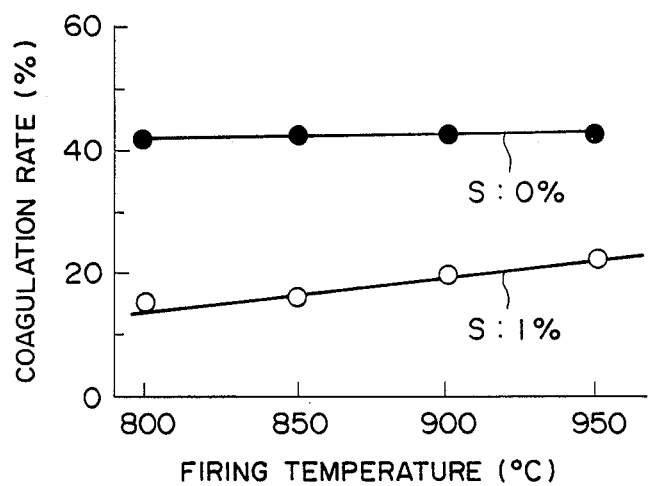
FIG. 4 is a graph which shows the relation between firing temperature and degree of coagulation of copper powder.

As is clear from these FIGS. 3 and 4, even in the case of copper alone, when S was added, coagulation was difficult to occur and so it is considered that S properly moderates the force of coagulation. The same results were obtained with use of Se and Te.

The present invention will be specifically explained by the following examples, wherein amount is based on weight.

Example 1

On an alumina base of 0.8 mm thick was provided an $SiO_2$—$Al_2O_3$—$ZnO$—$CaO$ glaze layer and the surface was polished to a maximum surface roughness of 1 μm or less. Thus finished plate was used as a base.

To 100 parts of spherical copper powder of 0.8 μm in average particle size were added 5 parts of a frit glass mainly composed of lead borosilicate, 8 parts of acrylic resin as a vehicle and 24 parts of butylcarbitol acetate as an organic solvent and this mixture was kneaded to prepare a copper paste. To this paste was added sulfur in various amounts of 0-4 parts for 100 parts of copper.

The resulting pastes were applied onto said alumina base by flexo-printing method to form a circuit pattern, which was dried at 120° C. for 10 minutes to form a film of 2-4 μm thick.

This film was fired at 850° C. for 10 minutes in a continuous belting type tunnel oven, during which nitrogen gas was passed therethrough to keep an inert atmosphere in the oven.

Surface state and adhesion strength of the copper film after fired are shown in Table 1.

The adhesion strength was determined by soldering a copper wire of 0.5 mm in diameter to a previously formed pad of 1.5 mm square, peeling the wire from the pad and measuring the peeling strength thereof.

As is clear from the Table, when addition amount of sulfur was 0.01 part or more, the surface state of film was good and film thickness was uniform, but when it exceeded 1 part, the adhesion strength decreased. When the amount was 0.01 part, a part of the base was exposed in island-like pattern in some cases, but there are no problems in practical use if the size of exposed portion is less than 10 μm in diameter and width of copper film circuit is 20 μm.

The circuit base having the film of No. 6 in Table 1 was subjected to heat cycle test. One cycle consisted of −55° C., 25 min→25° C., 5 min→150° C., 25 min→25° C., 5 min. After application of 1000 cycles, no changes were recognized in the copper film.

TABLE 1

| Sample No. | Amount of S (part) | State of film surface* | Film thickness (μm) | Adhesion strength (kgf/mm) |
| --- | --- | --- | --- | --- |
| 1 | 0 | x | Unmeasurable | 0.75 |
| 2 | 0.01 | Δ | 3.9 | 0.75 |
| 3 | 0.05 | o | 3.8 | 0.75 |
| 4 | 0.1 | o | 3.0 | 0.75 |
| 5 | 0.15 | o | 2.5 | 0.76 |
| 6 | 0.3 | o | 2.1 | 0.74 |
| 7 | 0.5 | o | 1.8 | 0.73 |
| 8 | 1 | o | 1.5 | 0.36 |
| 9 | 2 | o | 1.3 | 0.30 |
| 10 | 4 | o | 1.2 | 0.30 |

*o: Good with no island-like exposed portion.
Δ: Some island-like exposed portions occurred, but did not include exposed portions of 10 μm or more in diameter.
x: Ununiform surface with island-like exposed portions of 10 μm or more in diameter.

Example 2

Conductive pastes were prepared in the same manner as in Exmaple 1 except that four kinds of the spherical copper powders of 0.5, 0.8, 1.2 and 2.5 μm in diameter were uaed. Amount of sulfur added was 0.2 part.

Observation of the surface state of the fired film showed that when average particle diameter of the spherical copper powder used was 1.2 μm and 2.5 μm, the surface of base was exposed in island-like patterns When powders of 0.8 μm and 0.5 μm in particle size were used, continuous smooth film were obtained.

In Examples 1 and 2 were used bases having a glaze layer on which a thin copper circuit film can be formed more easily, but if the base has a smooth surface, the film may be formed directly thereon Example 3

In the same manner as in Example 1, on an alumina base of 0.8 mm thick was provided an $SiO_2$—$Al_2O_3$—$ZnO$—$CaO$ glaze layer and the surface was polished to a maximum surface roughness of 1 μm or less. This was used as a base for formation of film circuit.

To 100 parts of spherical copper powder of 0.8 μm in average particle size were added 5 parts of a frit glass mainly composed of lead borosilicate, 8 parts of acrylic resin as a vehicle and 24 parts of butylcarbitol acetate as an organic solvent and this mixture was kneaded to obtain a copper paste. To the paste was added S, Se and Te independently in various amounts of 0-0.5 part for 100 parts of copper.

These pastes were printed on the whole surface of said alumina base by flexo-printing method and dried at 120° C. for 10 minutes to form films of 2-4 μm in thickness. In this case, copper circuit films different in thickness were formed by changing the number of repetition of the printing-driving step.

Firing of said film was effected at 800° C. and 900° C. by a continuous belting type tunnel oven while passing nitrogen gas therethrough. Firing time was 5 minutes in both the cases.

Figure 5:
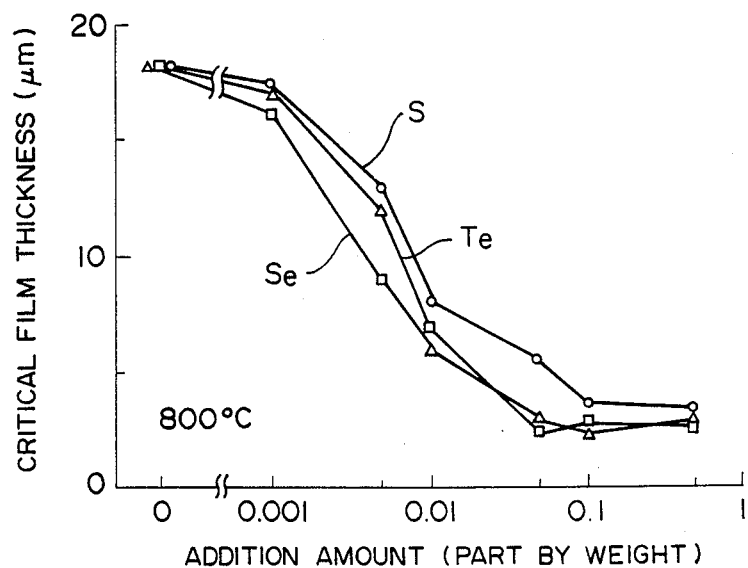
FIGS. 5 and 6 are graphs which show the relations between critical film thickness of copper circuit film and amounts of S, Se and Te added.
Figure 6:
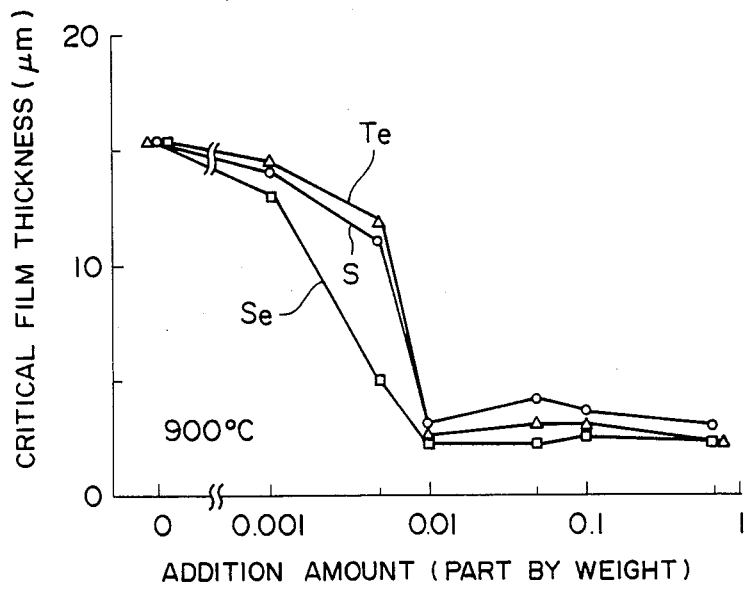

Surface of the fired copper film was enlarged by a light microscope and area of void portion of the copper film was measured and relation between void content and film thickness was obtained. From this relation, there was obtained the film thickness at which a film of 0% in void content, namely, a film free from defects (referred to as "critical film thickness" hereinafter) was obtained. The results are shown in FIGS. 5 and 6. FIG. 5 shows the results when firing temperature was 800° C. and FIG. 6 shows the results when firing temperature was 900° C. In these figures the addition amount is expressed by part by weight per 100 parts of copper.

It will be seen therefrom that although there are some differences among S, Se and Te, in case of 5 μm or less of critical film thickness, effect was exhibited with addition amount of 0.05 part or more at a firing temperature of 800° C. and 0.01 part or more at a firing temperature of 900° C.

Application Example 1

In the same manner as in Example 1, a copper film of 4 μm thick was formed on an alumina base provided with a glaze layer having a surface roughness of 1 μm or less using the conductive paste containing 0.5 part of S.

The resulting film had an adhesion strength of 0.8 kgf/mm and a sheet resistivity of 21 mΩ/□.

Using this film a circuit of 20 μm in minimum conductor width was formed by etching method according to photolithography to obtain a circuit component of a heat sensitive head for color printer. The copper circuit film was lower about 20% in sheet resistivity than conventional gold circuit film and thus width of circuit conductor can be correspondingly made thinner and margin for formation of circuit can be increased.

Application Example 2

Circuit loss of circuit film made from the copper paste of the present invention was compared with those of circuit films made from conventional gold, silver and silver-palladium conductive pastes.

Using each of these pastes a pattern of 1 mm in line width was formed on an alumina base by thick film printing method and the resulting patterns were compared on circuit loss of high frequency signal of 800-1000 MHz. The measurement was conducted by a network analyzer and the results are shown in FIG. 7.

Figure 7:
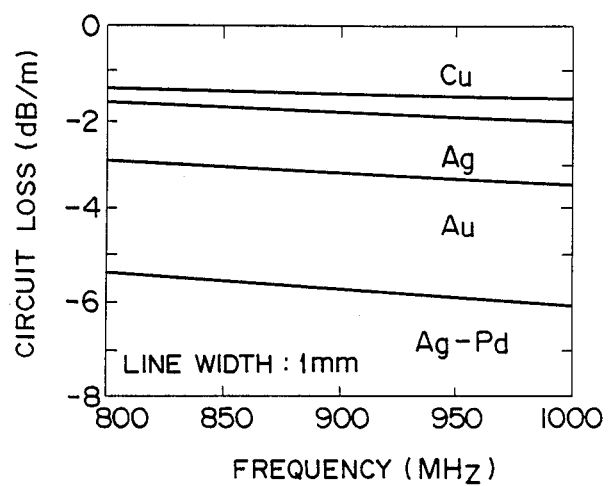
FIG. 7 is a graph which shows the relation between frequency and circuit loss of film circuit formed using various conductive pastes.

As is clear from FIG. 7, the copper circuit was the least in loss and is excellent as a circuit for electronic circuit component.

A voltage regulating transmitter module was made using said copper paste as a circuit film. When the circuit loss was the same as when the conventional gold circuit film was used, the size of module could be made smaller by about 10%.

According to the present invention, a copper film of 10 μm or less in film thickness can be easily formed on a ceramic base by a printing method and thus can provide an electronic circuit component having a fine circuit pattern comparable to the conventional gold film and has superior effect for electronic circuit component which requires low circuit loss.

What is claimed is:

1. An electrically conductive paste which comprises 100 parts by weight of a copper powder of 1 μm or less in average particle size, 0.01-4 parts by weight of at least one of S, Te and Se and a frit glass as a binder.

2. An electrically conductive paste according to claim 1 wherein content of the frit glass is 1-10 parts by weight.

3. An electrically conductive paste according to claim 1 wherein the frit glass is lead borosilicate glass which is contained in an amount of 2-7 parts by weight.

4. An electronic circuit component comprising an insulating base and a copper film circuit formed thereon by firing, wherein said copper film circuit consists essentially of 100 parts by weight of copper, 0.005-2 parts by weight of at least one of S, Te and Se and 1-10 parts by weight of a glass.

5. An electronic circuit component comprising an insulating base and a copper film circuit formed thereon by firing, wherein average surface roughness of said insulating base is 1 μm or less and is 1/5 or less of the thickness of film circuit formed thereon and said copper film circuit consists essentially of 100 parts by weight of copper, 0.005-2 parts by weight of at least one of S, Te and Se and 1-10 parts by weight of a glass.

6. An electronic circuit component according to claim 5 wherein the insulating base is a ceramic base.

7. An electronic circuit component comprising a ceramic base and a copper film circuit formed thereon by firing, wherein said ceramic base has a glaze layer on the surface and the copper film circuit provided on the glaze layer consists essentially of 100 parts by weight of copper, 0.005-2 parts by weight of at least one of S, Te and Se and 1-10 parts by weight of a glass.

8. An electronic circuit component according to claim 7 wherein the average surface roughness of the glaze layer provided on the ceramic base is 1 μm or less and is 1/5 or less of the thickness of circuit film provided thereon.

9. An electronic circuit component according to claim 7 wherein the glaze layer provided on the ceramic base comprises a glass of $SiO_2$—$Al_2O_3$—ZnO—CaO system.

10. An electronic circuit component comprising a ceramic base and a copper film circuit formed thereon by firing, wherein said ceramic base has a glaze layer on the surface and the copper film circuit provided on the glaze layer comprises a copper film of 1-10 μm thick which consists essentially of 100 parts by weight of copper, 0.005-2 parts by weight of at least one of S, Te and Se and 1-10 parts by weight of a glass.

11. An electronic circuit component according to claim 10 wherein line width of the copper film circuit is 5–20 μm.

12. A method for producing an electronic circuit component which comprises forming a copper circuit pattern on a ceramic base using a conductive paste consisting essentially of 100 parts by weight a copper powder of 1 μm or less in average particle size, 0.01–4 parts by weight of at least one of S, Te and Se and 1–10 parts by weight of a frit glass and then firing the pattern at a temperature within the range of from melting point of said frit glass to 1000° C. in an inert gas atmosphere to form a copper film circuit.

13. A method according to claim 12 wherein a glaze layer of 1 μm or less in surface roughness is formed prior to the formation of circuit on the ceramic base.

14. An electronic circuit component according to claim 4 wherein said at least one of S, Te and Se is contained in the copper film circuit in an amount of at least 0.005, and less than 1, part by weight.

15. An electronic circuit component according to claim 14 wherein said at least one of S, Te and Se is contained in the copper film circuit in an amount of 0.005–0.5 part by weight.

16. An electronic circuit component according to claim 4 wherein said copper film circuit consists of said copper, said at least one of S, Te and Se, and said glass.

17. An electronic circuit component according to claim 4 wherein said glass is at least one selected from the group consisting of lead borosilicate, bismuth borosilicate and zinc borosilicate.

18. An electronic circuit component according to claim 17 wherein the glass is lead borosilicate glass, and the glass is contained in the circuit film in an amount of 1–7 parts by weight.

19. An electronic circuit component according to claim 5 wherein said at least one of S, Te and Se is contained in the copper film circuit in an amount of at least 0.005, and less than 1, part by weight.

20. An electronic circuit component according to claim 19 wherein said at least one of S, Te and Se is contained in the copper film circuit in an amount of 0.005–0.5 part by weight.

21. An electronic circuit component according to claim 5 wherein said copper film circuit consists of said copper, said at least one of S, Te and Se, and said glass.

22. An electronic circuit component according to claim 7 wherein said at least one of S, Te and Se is contained in the copper film circuit in an amount of at least 0.005, and less than 1, part by weight.

23. An electronic circuit component according to claim 22 wherein said at least one of S, Te and Se is contained in the copper film circuit in an amount of 0.005–0.5 part by weight.

24. An electronic circuit component according to claim 7 wherein said copper film circuit consists of said copper, said at least one of S, Te and Se, and said glass.

25. An electronic circuit component according to claim 10 wherein said at least one of S, Te and Se is contained in the copper film in an amount of at least 0.005, and less than 1, part by weight.

26. An electronic circuit component according to claim 25 wherein said at least one of S, Te and Se is contained in the copper film in an amount of 0.005–0.5 part by weight.

27. An electronic circuit component according to claim 10 wherein said copper film consists of said copper, said at least one of S, Te and Se, and said glass.

28. A method according to claim 12 wherein said conductive paste contains an amount of said at least one of S, Te and Se such that after said firing said copper film circuit contains at least 0.005, and less than 1, part by weight of said at least one of S, Te and Se.

29. A method according to claim 28 wherein said conductive paste contains an amount of said at least one of S, Te and Se such that after said firing said copper film circuit contains 0.005–0.5 parts by weight of said at least one of S, Te and Se.

30. A method according to claim 12 wherein said conductive paste consists of said copper powder, said at least one of S, Te and Se, said frit glass, a vehicle and a solvent.

* * * * *